(12) United States Patent
Mulder et al.

(10) Patent No.: US 6,958,806 B2
(45) Date of Patent: Oct. 25, 2005

(54) LITHOGRAPHIC APPARATUS AND DEVICE MANUFACTURING METHOD

(75) Inventors: Heine Melle Mulder, Eindhoven (NL); Jan Hoegee, Delft (NL); Armand Eugene Albert Koolen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/717,971

(22) Filed: Nov. 21, 2003

(65) Prior Publication Data

US 2004/0114123 A1   Jun. 17, 2004

(30) Foreign Application Priority Data

Dec. 2, 2002 (EP) .................................. 02080031
May 9, 2003 (EP) .................................. 03076401

(51) Int. Cl.[7] ...................... G03B 27/74; G03B 27/42; G03B 27/54
(52) U.S. Cl. ........................... 355/68; 355/53; 355/67
(58) Field of Search ............................ 355/53, 67, 68, 355/71

(56) References Cited

U.S. PATENT DOCUMENTS 5,675,401 A * 10/1997 Wangler et al. ............... 355/67

5,684,567 A    11/1997  Shiozawa
6,040,894 A     3/2000  Takahashi

FOREIGN PATENT DOCUMENTS

| EP | 0 526 242 A1 | 2/1993 |
| EP | 0 687 956 A1 | 12/1995 |
| EP | 0 949 541 A2 | 10/1999 |

* cited by examiner

Primary Examiner—Alan Mathews
(74) Attorney, Agent, or Firm—Pillsbury Winthrop Shaw Pittman LLP (57) ABSTRACT

In a lithographic apparatus the angle dependence of the intensity distribution of a projection beam at a substrate is controlled. A beam splitter is located in the beam near a pupil plane. The beam splitter splits off an auxiliary beam, which is used to measure information about the spatial intensity distribution of the beam at the pupil plane. The measured position dependence in the auxiliary beam may be decontrolled using boundary conditions inherent to the illuminator to compensate for offset between the pupil plane and a detection element. The measured position dependence may be used to control parameters of an optical element that manipulates the position dependence in the pupil plane. An example of such an optical element is a matrix of elements that controllably steer the direction of parts of the beam. Thus a continuous feedback loop may be realized.

19 Claims, 3 Drawing Sheets

LITHOGRAPHIC APPARATUS AND DEVICE MANUFACTURING METHOD

BACKGROUND OF THE INVENTION

This application claims priority from European Patent Application Nos. 02080031.4, filed Dec. 2, 2002 and 03076401.3, filed May 9, 2003, which are herein incorporated by reference in their entirety.

1. Field of the Invention

The present invention generally relates to a lithographic apparatus and more particularly to a lithographic apparatus having an adjustable position dependent intensity distribution.

2. Description of Related Art

The term "patterning means" or "patterning structure" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such a device is that, for example, addressed areas of the reflective surface reflect incident light as diffracted light, whereas unaddressed areas reflect incident light as undiffracted light. Using an appropriate filter, said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors and unaddressed mirrors will reflect an incoming radiation beam in different directions; in this manner, the reflected beam is patterned according to the addressing pattern of the matrix-addressable mirrors. The required matrix-addressing can, for example, be performed using suitable electronic means. In both of the situations described above, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, said support structure may be embodied as a frame or table, for example, which may be fixed or movable as required; and A programmable liquid-crystal display (LCD) panel. An example of such a device is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as set forth above.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a device manufacturing process using a lithographic projection apparatus, a pattern (e.g., in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing,"

Third Edition, by Peter van Zant, McGraw Hill Publishing Co., 1997, ISBN 0-07-067250-4, incorporated herein by reference.

For the sake of simplicity, the projection system may hereinafter be referred to as the "lens," however, this term should be broadly interpreted as encompassing various types of projection system, including refractive optics, reflective optics, and catadioptric systems, for example, whereby any of these types of projection system may either be suitable for conventional imaging or be suitable for imaging in the presence of an immersion fluid. The radiation system may also include components operating according to any of these design types for directing, shaping, or controlling the projection beam of radiation, and such components may also be referred to below, collectively or singularly, as a "lens." Further, the lithographic apparatus may be of a type having two or more substrate tables (and/or two or more mask tables). In such "multiple stage" machines the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

In the present document, the terms "radiation" and "beam" are used to encompass all types of electromagnetic radiation, including ultraviolet (UV) radiation (e.g., with a wavelength of 365, 248, 193, 157 or 126 nm) and extreme ultra-violet (EUV) radiation (e.g., having a wavelength in the range 5–20 nm), as well as particle beams, such as ion beams or electron beams.

The radiation system has to ensure the realization of a desired intensity distribution as a function of position across the beam and as a function of angle of incidence of rays in the beam. The intensity distribution may either be defined at mask (reticle) level or at substrate (wafer) level. The desired position dependence, excluding mask generated patterns, generally should be uniform with constant intensity as a function of position on the substrate, and the desired angle dependence has to peak at certain angles. The desired angle dependence may depend on the nature of the pattern on the mask. Therefore it has to be possible to change properties of the illumination of the mask, so that the appropriate desired angular dependence can be realized. Very complex illumination systems are to ensure realization of the desired intensity distributions.

European Patent Application No. 1304850.9 (with corresponding U.S. application Ser. No. 10/157,033 assigned to the same assignee as the present application and having common inventors), which is incorporated herein by way of reference, describes examples of illumination systems. One illumination system has a laser source, followed by an optical element such as a Diffractive Optical Element (DOE), an axicon and a zoom lens. Following the DOE, axicon, and zoom lens, the beam passes through an optical integrator rod. The rod evenly smears out the intensity distribution as a function of position, conserving most of the angle dependence. This means that at the exit side of the rod, the spatial intensity distribution over the complete cross-section of the rod is almost perfectly uniform.

The DOE, axicon and zoom lens are used to shape the angle dependent intensity distribution of the projection beam at the substrate ("angle" in this context may refer to the angle relative to the main direction of the beam, as well as to an angle rotated around that main direction). As an alternative to at least the DOE a matrix of individually, electronically orientable micro-mirrors or micro-lenses has been proposed. By controlling the fractions of mirrors that reflect the beam in various directions very detailed control of the angle dependent intensity distribution is made possible. It has also been proposed to perform the function of the axicon by a DOE.

Such a highly complex illumination system should be accurately configured to ensure the desired uniformity and intensity distribution as a function of angle at the substrate. Small deviations in the illumination system may affect the intensity distribution. Also erratic factors, such as contamination may be of importance.

Generally, a correct intensity distribution is ensured by a set-up procedure, which involves choosing the components needed for illuminating a particular mask and adjustment of the parameters of these components prior to exposing the substrate, to ensure that the desired intensity distribution as a function of position and angle will be realized. The parameters involve for example the distance between the elements of the axicon and/or the orientation of the mirrors in the matrix of mirrors.

It has proven possible to measure the position dependence of the intensity distribution at the substrate. For this purpose a detector may be included near the substrate, or near the mask, where there is usually sufficient space for such a detector.

Measurement of the angular intensity distribution is less straightforward. In principle the angular distribution can be measured directly with position dependent intensity detection in or near a pupil plane, that is, inside the optical system. Alternatively, a pinhole can be placed at mask level while measuring the defocused image of the pinhole in the form of a defocused spatial intensity distribution at substrate level, which corresponds to the angular intensity distribution at mask level. In both scenarios however, the normal imaging process is interrupted. The relation between a pupil plane and the plane of the mask is that the intensity distribution as a function of position in the pupil plane determines the intensity distribution as a function of angle at the mask. Vice versa the intensity distribution as a function of angle in the pupil plane determines the intensity distribution as a function of position at the mask (although the latter relation is altered in a lithographic apparatus by passing the projection beam through an internally reflecting rod). This relation arises because between the pupil plane and the mask an optical structure is included with an effective focal distance so that the pupil plane is at the effective focal distance from the optical structure.

Measurement of position dependent intensity at a pupil plane currently involves an interruption of normal operation of the apparatus, because it may involve putting a detector into the pupil plane. In the set-up for normal operation many components of the illumination system generally crowd the space in the vicinity of the pupil plane, for example because they are needed to control the illumination pattern at the pupil plane. Obviously, when the measurement of position dependent intensity at a pupil plane is alternatively performed using a detector at an object or image plane, normal operation of the apparatus is also interrupted.

After checking the intensity distribution at the pupil plane measured with the detector and adjusting the parameters of the optical components that affect the intensity distribution in the pupil plane, the apparatus is restored to normal operating order so that the beam can reach the substrate. The optical components that affect intensity distribution in the pupil plane are subsequently left as set-up to retain the required angle dependence.

This procedure has the disadvantage that it increases the time before the apparatus can be used after a change of mask. Moreover, it excludes dynamic control over the angle dependent intensity distribution of the radiation beam.

SUMMARY OF THE INVENTION

It is an aspect of embodiments of the present invention to make it possible to obtain information about the intensity distribution in the pupil plane without disrupting operability of the lithographic apparatus.

It is another aspect of embodiments of the present invention to make it possible to adjust the configuration of the illumination system at any time to control a desired intensity distribution in the pupil plane dependent on measured information about the intensity distribution.

It is a further aspect of embodiments of the present invention to make it possible to obtain information about the intensity distribution in the pupil plane without taking up space used by components close to the pupil plane that constructively affect the intensity distribution in the pupil plane.

Thus, instead of a detector that has to be moved in and out of the projection beam of the lithographic apparatus to obtain information about the intensity distribution in the pupil plane, a permanent arrangement is used, with a beam splitter that splits off an auxiliary beam from the projection beam. Information about the intensity distribution of the projection beam in the pupil plane is obtained from measurements in the auxiliary beam.

The information obtained from the intensity distribution across the auxiliary beam may be used to adjust the optical components that are used to manipulate the position dependence of the intensity distribution in the pupil plane. Thus, for example, the fraction of mirrors in the matrix that reflect the projection beam in a certain direction may be modified so that the measured distribution more closely approaches the required distribution. The axicon may be adjusted to change the diameter of a ring of light in the pupil plane, or the zoom factor of the zoom lens may be adjusted etc, all dependent on information from the measurements of the intensity distribution in the auxiliary beam.

Preferably a feedback loop from the detector is used for this purpose. Because the beam splitter is substantially permanently in the beam, control over the angle dependence is thus permanently possible. By "substantially permanently" is meant that the structure remains in position during operation of the lithographic projector apparatus. It may be removable, e.g., for maintenance. This makes it possible to use dynamic control over the angle dependence during exposure of a substrate. Also rapid changes and verifications of the desired intensity distribution can be realized.

Preferably, one or more set values are provided, which define at least part of the desired illumination pattern for the mask in current use in the lithographic apparatus, and parameters of the optical components are controlled to change the measured values toward the set values.

Control over the angular dependence of the intensity distribution of the beam at the substrate may be combined with control over the position dependent intensity distribution of the beam at the substrate. For measuring the latter distribution, a second intensity detector is preferably used at substrate or mask level. Thus at least two feedback loops control the intensity distribution of the beam, each with a detector located at a different position with respect to the beam.

To reserve as much space as possible for optical elements that manipulate the intensity distribution, the location of the detection element in the auxiliary beam is preferably not exactly in the pupil plane. As a result, there is generally a discrepancy between the measured intensity distribution across the auxiliary beam and the desired distribution in the pupil plane. A deconvolution operation is preferably applied to the measured intensity distribution across the auxiliary beam to compensate for this discrepancy. Boundary conditions to be used in this deconvolution operation comprise imaging properties of the illumination system such as for example the shape and size of the exit of the integrator rod, or for example the specific ray tracing of a point source located at the exit side of the rod passing through optical elements later on in the beam path. The deconvolution operation may be performed using a suitably programmed computer, which processes information obtained from the measurements.

The detector may be realized by using a partially transparent mirror surface which reflects a portion of the projection beam, with a detector attached to a rear side of the mirror surface. The detector may include a CCD sensor matrix, if necessary preceded by a fluorescent layer to generate signal detectable for the CCD. By placing the detector, or at least the fluorescent layer substantially immediately behind the mirror the discrepancy between the intensity distribution at the pupil plane and at the detector is minimized. It must be noted that the plane of measurement and the image plane of the pupil may be oriented under a relative angle of 45 degrees. To calculate the intensity distribution in the pupil plane, therefore requires an extra calculation step making use of predetermined optical transformation properties of the specific illuminator in use. These transformation properties can be determined numerically using ray trace methods, which are generally understood by those of ordinary skill in the art.

In the illumination system of known lithographic apparatus the pupil plane may be followed by a coupling lens, a light homogenizing rod and a condenser lens in the path of the beam before the mask. The rod more evenly distributes the intensity as a function of position on the mask, while maintaining most of the angle dependence. Similarly, a fly's eye lens or other type of homogenizer may be used. In the condenser lens behind the rod a second pupil plane arises before the beam reaches the mask. In one particular embodiment the beam splitter is located in the path of the projection beam substantially immediately following the condenser lens. It has been found that this location ensures useable detection information, without disrupting the illumination system in such a way that control over the intensity distribution is reduced.

In another embodiment, the beam splitter is located preceding the pupil plane that has been mentioned, between the optical structure that shapes the angle dependence (including for example the matrix of mirrors, the DOE, the axicon and/or the zoom lens) and the rod. This position makes it possible to locate the detector at a plane in the auxiliary beam that is equivalent to the pupil plane of the projection beam. Thus less discrepancy needs to arise between the detected intensity distribution and the actual intensity distribution.

The invention also provides a device manufacturing method including providing a substrate that is at least partially covered by a layer of radiation-sensitive material, providing a projection beam of radiation using a radiation system, the radiation system comprising an illumination system for defining a position dependence of an intensity distribution of the projection beam in a pupil plane, the position dependence determining an angle dependence of the intensity distribution of the projection beam at the substrate, using patterning means to endow the projection beam from the pupil plane with a pattern in its cross-section, projecting the patterned beam of radiation onto a target portion of the layer of radiation-sensitive material, splitting off an auxiliary beam from the projection beam, measuring an intensity distribution across the auxiliary beam, and controlling an intensity distribution at the pupil plane dependent on the intensity distribution measured across the auxiliary beam.

BRIEF DESCRIPTION OF THE INVENTION

Embodiments of the invention will now be described, by way of example only, with reference to the accompanying schematic drawings in which corresponding reference symbols indicate corresponding parts, and in which.

DETAILED DESCRIPTION OF THE INVENTION

Embodiment 1

Figure 1:
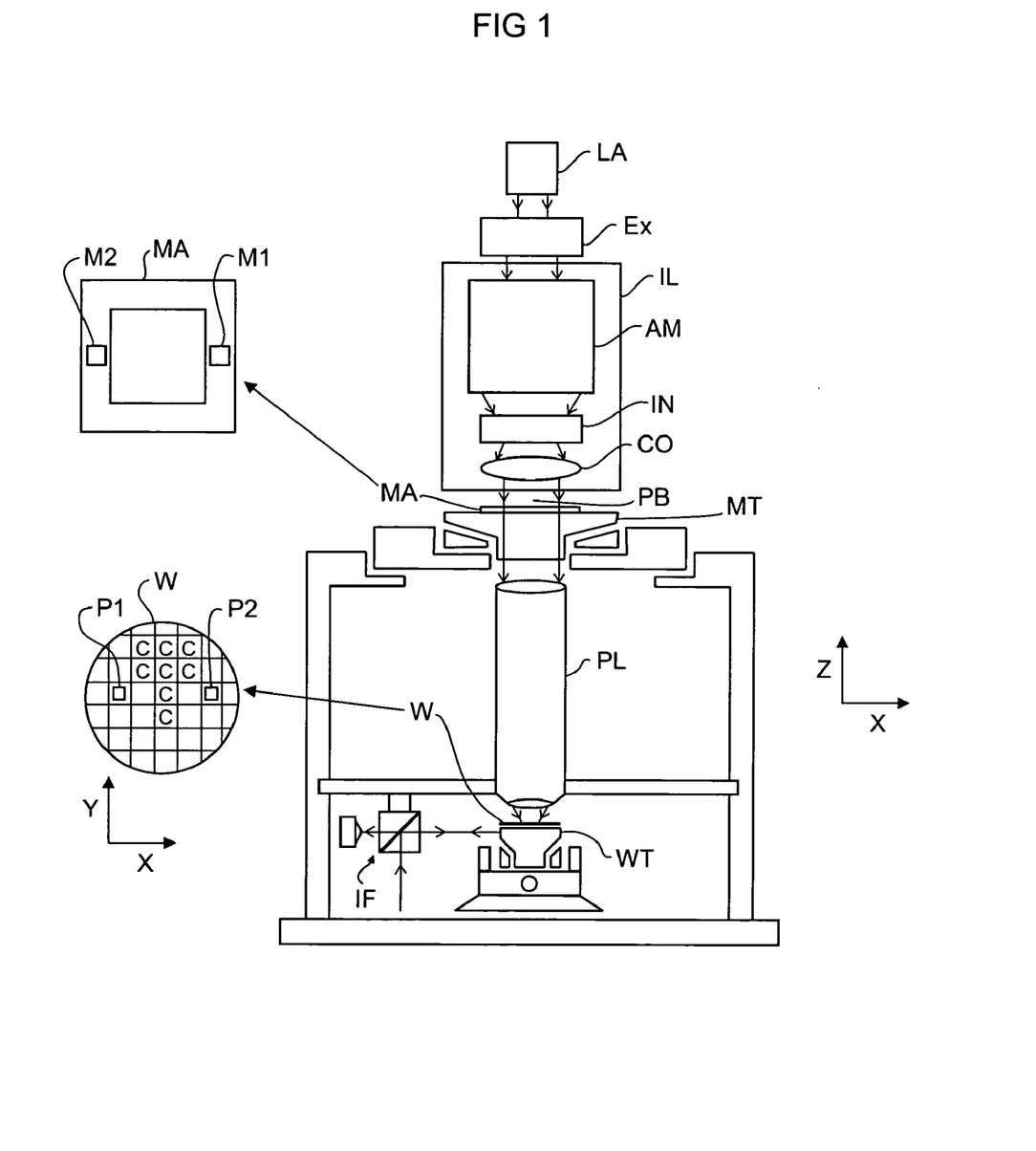
FIG. 1 depicts a lithographic projection apparatus according to an embodiment of the invention.

FIG. 1 schematically depicts a lithographic apparatus according to a particular embodiment of the invention. The apparatus comprises:

a radiation system Ex, IL, for supplying a projection beam PB of radiation (e.g., ultraviolet radiation). In this particular case, the radiation system also comprises a radiation source LA;

a first object table (mask table) MT provided with a mask holder for holding a mask MA (e.g., a reticle);

a second object table (substrate table) WT provided with a substrate holder for holding a substrate W (e.g., a resist-coated silicon wafer); and a projection system ("lens") PL (e.g., a refractive, reflective or catadioptric lens) for imaging an irradiated portion of the mask MA onto a target portion C (e.g., comprising one or more dies) of the substrate W.

As here depicted, the apparatus is of a transmissive type (i.e., has a transmissive mask). However, in general, it may also be of a reflective type, for example, with a reflective mask. Alternatively, the apparatus may employ another kind of patterning means, such as for example a programmable mirror array of a type as referred to above.

The source LA (e.g., an excimer laser) produces a beam of radiation. This beam is fed into an illumination system (illuminator) IL, either directly or after having traversed conditioning means, such as for example a beam expander Ex. The illuminator IL may comprise adjusting means AM for adjusting the angular intensity distribution in the beam. Generally, at least the outer and/or inner radial extent (commonly referred to as σ-outer and σ-inner, respectively) of the intensity distribution in a pupil plane of the radiation system can be adjusted. In addition, the illuminator IL will generally comprise various other components, such as an integrator IN and a condenser CO. In this way, the beam PB impinging on the mask MA has a desired uniformity and intensity distribution in its cross-section. It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of an interferometric measuring means IF, the substrate table WT can be moved accurately, e.g., so as to position different target portions C in the path of the beam PB. The mask MA can also be positioned with respect to the path of the beam PB, e.g., after mechanical retrieval from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash." Instead, the mask table MT is moved in a given direction (the so-called "scan direction," e.g., the y direction) with a speed v, so that the projection beam PB is caused to scan over the mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
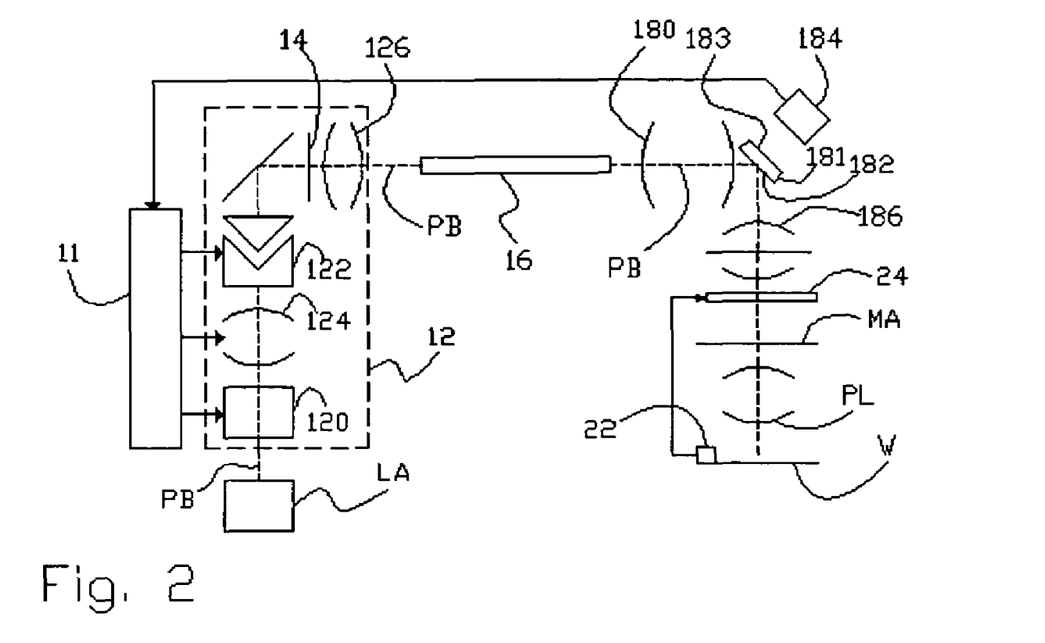
FIG. 2 schematically shows an embodiment of an optical path.

FIG. 2 shows a more detailed schematic view of an embodiment of the optical path of the lithographic apparatus, including the illumination system. Beam PB is indicated by a dashed line. Beam PB passes from radiation source LA through an angular dependence shaping unit 12, a rod 16, first condenser lens 180, second condenser lens 186, position dependence control unit 24, mask MA, projection lens PL onto substrate W. A position dependent intensity detector 22 is included near substrate W, with an output coupled to position dependence control unit 24 (for correcting field plane non-uniformity at the mask MA). Here and in the following the word "lens" should be understood as a general term, referring not just to a single piece of optically shaped glass, but more generally including various types of optically active systems, including refractive optics, reflective optics, and catadioptric systems, composed of a single element or of a combination of elements.

In the path of beam PB a beam splitter 181 has been inserted in the form of a mirror whose front surface 182 reflects a majority of the beam PB, passing a fraction of the beam as an auxiliary beam to the back surface of the mirror, on which a detection element in the form of a fluorescent sheet 183 has been provided. A position dependent sensor 184 in the form of a CCD camera is pointed at fluorescent sheet 183. Sensor 184 is coupled to an input of a control unit 11, which has an output coupled to angular dependence shaping unit 12. By way of example angular dependence shaping unit 12 is shown to contain a first shaping element 120, a zoom lens 124 and an axicon 122. First shaping element 120 contains for example an array of micro mirrors, that each reflect part of the beam in a controllable direction. Angular dependence shaping unit 12 produces an intensity distribution with a controlled position dependence at an initial pupil plane 14. A coupling lens 126 couples the beam from pupil plane 14 into rod 16.

In operation, the optical elements preceding initial pupil plane 14 serve to manipulate the position dependence of the intensity distribution in the pupil plane. Optical elements 126, 180, 186 following pupil plane 14 convert the position dependence into an angle of incidence dependence of the intensity of beam PB at mask MA and, via projection lens PL at substrate W. The angle dependence of the intensity distribution at pupil plane 14 results in a position dependence of the intensity distribution of beam PB at mask MA, but only after being smeared out by rod 16, so that a substantially uniform position dependence occurs at mask MA.

In first condenser lens 180 an image of initial pupil plane 14 occurs (in fact a plurality of overlapping images of pupil plane 14, as a result of reflections in rod 16). Radiation emerging from this second pupil plane passes to semitransparent mirror 181, through which a fraction (e.g., 1%) of the radiation is passed to fluorescent layer 183 at the back surface of mirror 181. Radiation impinging on fluorescent layer 183 gives rise to a position dependent light pattern. Sensor 184 measures the 2-dimensional position dependence of this pattern. Sensor 184 passes measured information about this pattern to control unit 11.

Control unit 11 uses the information to control parameters of one or more of the optical elements 120, 122, 124 that manipulate the position dependence of the intensity distribution in initial pupil plane 14, so as to make the position dependence fit a predetermined pattern that has been selected for a particular mask MA that is used to pattern beam PB.

In one example, first shaping element 120 contains a matrix of mirrors each with an individually controllable orientation. The orientation affects the direction of reflection of part of the beam. First shaping element 120 thereby provides an initial angular distribution of radiation. Optical elements such as zoom lens 124 between this matrix and initial pupil plane 14 can subsequently increase or decrease the angles of radiation.

In this example controller 11 uses the measured position dependence to control orientation of the mirrors. Prior to processing, controller 11 may normalize the measured intensity pattern and the desired pattern with respect to one another so that their spatial averages are equal to each other. Controller 11 determines areas in the pupil plane over which the measured intensity exceeds the predetermined pattern. Controller 11 then computes a required reduction in the number of mirrors that reflect radiation from beams PB into those areas so that the intensity over these areas will be reduced to the intensity according to the predetermined pattern. Subsequently controller 11 sends control signals to first shaping element 120 to redirect a corresponding number of the mirrors that previously reflected radiation into these areas. Controller 11 may treat areas over which the predetermined pattern exceeds the measured intensity in the opposite way, controlling an increased number of mirrors to reflect the patterned beam into those area.

More generally, controller 11 may compute the redirection by searching for some matrix of redirection angles for the matrix of mirrors, so as to minimize a distance criterion between the predetermined pattern and a predicted effect of the matrix of redirection values.

In other examples, controller 11 may control the distance between the elements of axicon 122 and/or the zoom factor of zoom lens 124 dependent on the measured intensity. The zoom factor may be controlled for example dependent on a weighted average of the measured intensity, averaged over different positions in the pupil plane weighted with increasing weight as a function of the distance from the centre of zoom magnification. Dependent on whether the weighted average is above or below a reference value, the zoom factor is decreased or increased. A similar average, with weights changing from positive to negative near an edge in a required ring in the illumination pattern in the pupil plane, may be used to control axicon 122.

Instead of a matrix of mirrors a matrix of refractive or diffractive elements (e.g., micro-lenses or holographic elements) may be used. Alternatively, some form of position dependent control near initial pupil plane 14 can be introduced, for example in the form of a matrix of controllable elements with programmable degrees of transmissivity.

In the embodiment of FIG. 2 the detecting element (fluorescent layer 183) is close to an image plane of initial pupil plane 14 in a compound lens comprising lenses 180 and 186 (here the word "image plane" is used in the sense that the optical distances between the initial pupil plane 14 and the image plane and the various optical elements in between correspond to an imaging relationship, although of course reflection in rod 16 has the effect of adding a number of mirror images of initial pupil plane 14). Placing the detection element in this way after rod 16 in the path of beam PB has the advantage that any effect of rod 16 on the angle dependence of the intensity distribution at mask MA can be corrected by controller 11. Because the image of the pupil plane generally occurs within the system of lenses that makes up compound lens 180 and 186 it is generally impossible to locate the detecting element permanently exactly in the image of initial pupil plane 14.

As a result certain discrepancies may occur between the position dependent intensity distribution in the image of the pupil plane and the detected intensity distribution. Preferably, controller 11 corrects these discrepancies before using the intensity distribution to control parameters of one or more of optical elements 120, 122, 124 of angular dependence shaping unit 12. Correction involves deconvolution of the optical effect of the displacement between the image of the pupil plane and detection element 183. Imaging properties inherent to the illumination system are used as boundary conditions in this deconvolution operation. Boundary conditions comprise for example the shape and size of the exit of rod 16, and for example findings from a ray trace model of a point source located at the exit side of the rod radiating towards the image of the pupil plane and towards the plane of measurement. Numerical methods of calculating a deconvolution making use of boundary conditions are known per se. Controller 11 may use any such method to obtain an estimate of the intensity distribution in an image plane of the pupil plane for use in controlling the parameters of the optical elements in angular dependence shaping unit 12.

For improved accuracy in deconvolution use may be made of the fact that the intensity distribution at the second pupil plane is substantially mirror symmetric in two orthogonal directions, since beam PB has been passed through rod 16 before forming the image. In addition, the angular intensity distributions of the beams emerging from different points at the exit side of the rod are equal. In a further embodiment controller 11 may also receive information about the intensity distribution as a function of position at mask MA or substrate W; in this embodiment the controller uses this information to correct the deconvolution operation or the boundary conditions.

Figure 2A:
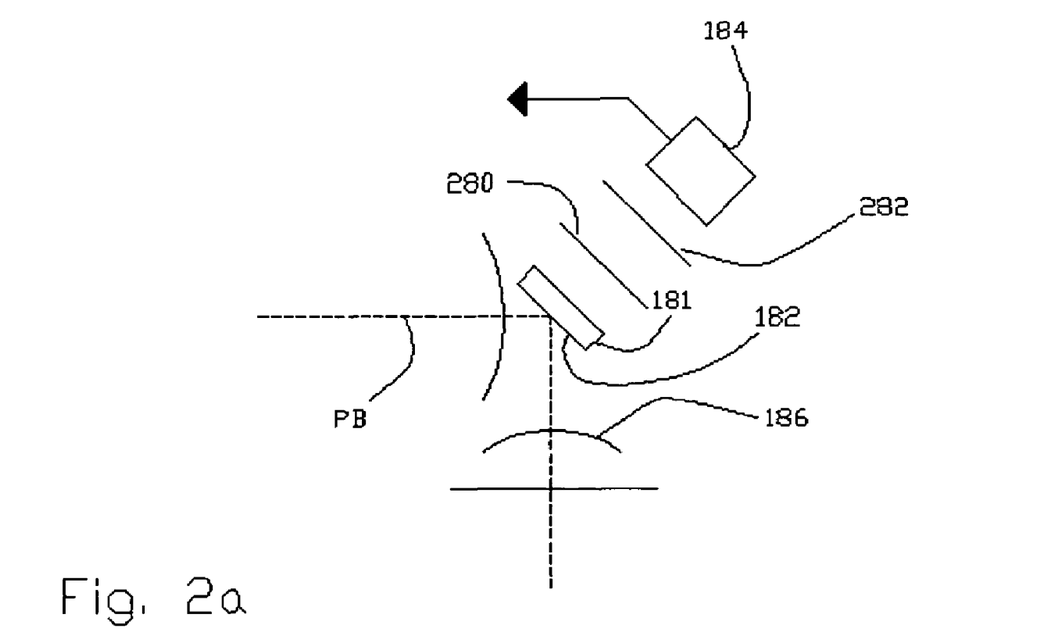
FIG. 2a schematically shows a detail of an optical path.

FIG. 2a shows a detail of a modified version of the optical path of FIG. 2. In this modified version, one or more additional optical elements 280 are included behind mirror 181 followed by a detection element 282. In this embodiment the detection element is not included immediately at the back surface of mirror 181. The additional optical element or elements 280 may be used to correct optically for the effect of displacement between the pupil plane and the detection element (e.g., by creating another image of the pupil), or at least to make correction for this effect easier to implement.

In yet another version (not shown), the detector further comprises an intransparent sheet with one or more transparent pinholes. In the case of a single pinhole, the sheet is preferably movable in a plane transverse to the auxiliary beam direction. In the case of a sheet containing many pinholes, the sheet is preferably static. The pinhole sheet may be included at the back surface of mirror 181, immediately followed (for example at a distance of 1 mm) by detection element 282. In operation, the sensor measures an angle dependency of the intensity of the light passing through the pinhole, by detecting the intensity at some distance behind the pinhole as a function of position transverse to the beam direction. Hereby, the detector measures the intensity as a function of both position of the pinhole and angle of the rays of radiation passing through the pinhole.

Controller 11 may be implemented as a suitably programmed computer which processes data from sensor 184 and sends out control signals to angular dependence shaping unit 12. Optionally, part of the processing, such as deconvolution may be executed by a digital signal processor (not shown). Controller 11 preferably has an input, for example via a local area network, to receive information about the mask MA inserted in beam PB, or more particularly about the type of angle dependence of the intensity distribution at mask MA that is desired for that particular mask. A new desired angle dependency may be selected each time when the mask is changed.

Dependent on the embodiment controller 11 may be active to control angular dependence shaping unit 12 part of the time. In a first embodiment, controller 11 controls angular dependence shaping unit 12 dependent on data from sensor 184 only after mask MA has been changed, but before any relevant substrate W is exposed. After capturing an appropriate setting of the parameters of angular dependence shaping unit 12, this setting is frozen during subsequent exposure of one or more substrates W. In a second embodiment, controller keeps controlling angular dependence shaping unit 12 dependent on data received during exposure of substrate W as well. Thus dynamic real-time control of the angle dependence is realized, which may be used to compensate for disturbances during exposures.

In a third embodiment controller 11 may change the angle dependence during exposure of a substrate, or between flashes of exposure of the same substrate in order to expose the substrate with radiation with successively different angle dependent intensity distributions. Thus more accurately controllable illumination may be realized, avoiding for example interference effects between radiation incident from different angles, by illuminating from these angles successively. Because of the permanent (real-time) detection of the pupil shape such control can be realized accurately and quickly.

Figure 3:
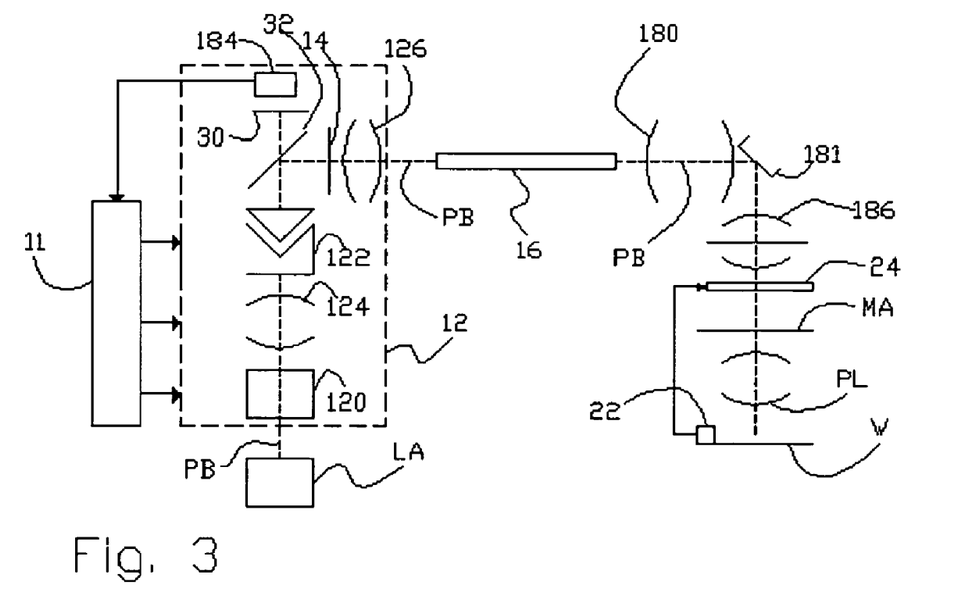
FIG. 3 schematically shows another embodiment of an optical path.

FIG. 3 schematically shows the light path of a different embodiment of the lithographic apparatus. Here, detecting element 30 and sensor 184 have been placed behind a semi-transparent mirror 32 that precedes initial pupil plane 14 in the path of beam PB. Preferably detecting element 30 (for example a fluorescent sheet) is placed at a distance from mirror 32, so that the optical distance from mirror 32 to initial pupil plane 14 substantially equals the distance from mirror to detection element. Thus, no deconvolution is needed. However, detection element 30 may also be provided at the back of mirror 32. In this case deconvolution may be needed, dependent on the distance to initial pupil plane 14 and the required accuracy. Similarly, optical elements (not shown) may be included behind mirror 32 to realize a more accurate pupil image at a desired distance from mirror 32.

Sensor 184 in the embodiment is preferably a conventional CCD camera, with a lens that demagnifies the size of detection element 30 to the size of the CCD sensitive surface area. However, if a sensor array of sufficient size is available to spread across the beam diameter, the sensor array may be included immediately behind detection element 30. When sensor 184 is sensitive to radiation at the wavelength of beam PB, the separate detection element 30 may even be omitted.

While specific embodiments of the invention have been described above, it will be appreciated that the invention may be practiced otherwise than as described. The description is not intended to limit the invention. For example, although use of a mirror has been shown which reflects the main beam and transmits the auxiliary beam, it will be understood that alternatively a mirror may be used that transmits the main beam and reflects the auxiliary beam. In this case, of course, the detection element is preferably not included immediately on the mirror, but at some distance from it, so as not to hinder the main beam.

We claim:

1. A lithographic apparatus comprising:
    a radiation system to provide a projection beam of radiation, the radiation system comprising an illumination system for defining a position dependent intensity distribution of the beam in a pupil plane;
    a support structure for supporting a patterning structure, the illumination system defining an angle dependent intensity distribution of the beam at the patterning structure dependent on the position dependent intensity distribution in the pupil plane;
a substrate table for holding a substrate;
a projection system for projecting the patterned beam onto a target portion of the substrate;
a beam splitter positioned in a path of the projection beam during operation of the lithographic apparatus, the beam splitter splitting off an auxiliary beam;
a detector with a detection element disposed in a path of the auxiliary beam so as to detect information about a position dependent intensity distribution corresponding to the pupil plane; and
a controller having an input coupled to said detector and an output coupled to said illumination system,
wherein the controller is configured to receive detected information from said detector and to provide a feedback to said illumination system to control a parameter of the illumination system.

2. A lithographic apparatus according to claim 1, wherein the illumination system comprises an optical element having a controllable parameter and the controller is configured to control said parameter depending on the detected information.

3. A lithographic apparatus according to claim 2, wherein the controller comprises an interface for receiving a desired position dependence of the intensity distribution at the pupil plane, and wherein the controller is arranged to regulate the parameter so as to approximate the desired position dependence.

4. A lithographic apparatus according to claim 2, wherein the optical element comprises a matrix of elements, each element in said matrix of elements redirecting the projection beam in a respective individually controllable direction, and wherein the controller is configured to control a fraction of the elements to redirect the beam to an area in said pupil plane depending on a discrepancy between a desired and a measured intensity over said area.

5. A lithographic apparatus according to claim 2, wherein the controller is arranged to control the parameter depending on the measured position dependence, at least during exposure of the substrate.

6. A lithographic apparatus according to claim 1,
wherein the beam splitter is located at an offset position from the pupil plane in the path of the projection beam,
wherein the detection element is arranged to detect an intensity distribution across the auxiliary beam, and
wherein the controller comprises a deconvolution unit for deconvoluting a discrepancy between the intensity distributions at the pupil plane and at the detection element due to propagation of radiation along a sub-path between the pupil plane and the detection element.

7. A lithographic apparatus according to claim 1, wherein the beam splitter comprises a mirror surface configured to reflect a portion of the projection beam and to transmit another portion of the projection beam as the auxiliary beam, and wherein the detection element is arranged to substantially intercept the auxiliary beam at a back side of the mirror surface.

8. A lithographic apparatus according to claim 1, further comprising a correction element, wherein the beam splitter comprises a mirror surface configured to reflect a portion of the projection beam and to transmit another portion of the projection beam as the auxiliary beam, and wherein the detection element is positioned to intercept the auxiliary beam following the mirror surface, and the correction optical element is disposed between the mirror surface and the detection element.

9. A lithographic apparatus according to claim 1, further comprising:
a light conducting rod having reflecting side walls to reduce position dependence of the intensity distribution of the beam, the rod being disposed in the path of the projection beam between the pupil plane and a first image plane of the pupil plane; and
at least one optical element configured to image the pupil plane onto the first image plane of the pupil plane,
wherein the beam splitter is positioned downstream of the light conducting rod.

10. A lithographic apparatus according to claim 1, wherein the beam splitter is positioned in the path of the beam preceding the pupil plane.

11. A device manufacturing method comprising:
patterning a projection beam with a pattern in its cross-section, the projection beam having a position dependent intensity distribution in a pupil plane of a radiation system providing the projection beam, the position dependent intensity distribution determining an angle dependent intensity distribution of the projection beam at a substrate;
projecting the patterned projection beam onto a target portion of a layer of radiation-sensitive material on the substrate;
splitting an auxiliary beam from the projection beam;
measuring an intensity distribution across the auxiliary beam; and
controlling an intensity distribution at the pupil plane by returning the intensity distribution measured across the auxiliary beam via a feedback loop.

12. A device manufacturing method according to claim 11, wherein said measuring comprises measuring a desired position dependence of the intensity distribution at the pupil plane, and
wherein said controlling comprises controlling the measured position dependence so as to make the position dependence of the intensity distribution of the beam approximate the desired position dependence of the intensity distribution by controlling a parameter of the illumination system via the feedback loop.

13. A device manufacturing method according to claim 12, further comprising:
adapting a fraction of a matrix of elements in the illumination system to redirect the beam to an area in said pupil plane depending on a discrepancy between a desired and a measured intensity over said area, each element in the matrix of elements is adapted to redirect the projection beam in a respective individually controllable direction.

14. A device manufacturing method according to claim 11, wherein said controlling comprises controlling a parameter of the illumination system depending on the measured position dependence during exposure of the layer of radiation-sensitive material.

15. A device manufacturing method according to claim 11, wherein said splitting comprises splitting the auxiliary beam from the projection beam at a location offset from the pupil plane in the path of the projection beam, and said measuring comprises measuring the intensity distribution in a plane across the auxiliary beam and deconvoluting a discrepancy between the intensity distribution at the pupil plane and the intensity distribution at said plane.

16. A device manufacturing method according to claim 11, wherein said splitting comprises using a partially transparent mirror surface to reflect a portion of the projection beam and to transmit another portion of the projection beam to form the auxiliary beam, said auxiliary beam being intercepted substantially at a back surface of said mirror surface so as to detect the intensity distribution.

17. A device manufacturing method according to claim 11, further comprising:
   homogenizing the intensity distribution of the projection beam, and
   after said homogenizing, splitting off said auxiliary beam.

18. A device manufacturing method according to claim 11, further comprising regulating a position dependence of the intensity distribution of the projection beam at the substrate in parallel with regulating the position dependence at the pupil plane.

19. A lithographic apparatus comprising:
   a radiation system to provide a projection beam of radiation, the radiation system comprising an illumination system for defining a position dependent intensity distribution of the beam in a pupil plane;
   a support structure for supporting a patterning structure, the illumination system defining an angle dependent intensity distribution of the beam at the patterning structure dependent on the position dependent intensity distribution in the pupil plane;
   a substrate table for holding a substrate;
   a projection system for projecting the patterned beam onto a target portion of the substrate;
   a beam splitter positioned in a path of the projection beam during operation of the lithographic apparatus, the beam splitter splitting off an auxiliary beam;
   a detector with a detection element disposed in a path of the auxiliary beam so as to detect information about a position dependent intensity distribution corresponding to the pupil plane;
   a light conducting rod having reflecting side walls to reduce position dependence of the intensity distribution of the beam, the rod being disposed in the path of the projection beam between the pupil plane and a first image plane of the pupil plane; and
   at least one optical element configured to image the pupil plane onto the first image plane of the pupil plane,
   wherein the beam splitter is positioned downstream of the light conducting rod.

* * * * *